United States Patent
Assefa et al.

(10) Patent No.: US 9,105,686 B2
(45) Date of Patent: Aug. 11, 2015

(54) FABRICATION OF LOCALIZED SOI ON LOCALIZED THICK BOX USING SELECTIVE EPITAXY ON BULK SEMICONDUCTOR SUBSTRATES FOR PHOTONICS DEVICE INTEGRATION

(71) Applicant: International Business Machines Corporation, Armonk, NY (US)

(72) Inventors: Solomon Assefa, Ossining, NY (US); William M. Green, Astoria, NY (US); Marwan H. Khater, Astoria, NY (US); Yurri A. Vlasov, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 13/667,384

(22) Filed: Nov. 2, 2012

(65) Prior Publication Data

US 2014/0127878 A1  May 8, 2014

(51) Int. Cl.
*H01L 21/762* (2006.01)

(52) U.S. Cl.
CPC .... *H01L 21/76232* (2013.01); *H01L 21/76205* (2013.01)

(58) Field of Classification Search
CPC .............. H01L 21/762; H01L 21/6232; H01L 21/76224; H01L 21/31056; H01L 21/76232; H01L 21/76243; H01L 21/76267; H01L 21/02532; H01L 21/02647; H01L 21/02639; H01L 21/0262; H01L 21/02661
See application file for complete search history.

(56) References Cited

U.S. PATENT DOCUMENTS

| | | | |
|---|---|---|---|
| 5,229,318 A | 7/1993 | Straboni et al. | |
| 6,407,005 B2 * | 6/2002 | Weon | 438/756 |
| 8,214,235 B2 | 7/2012 | Tait et al. | |
| 2005/0255649 A1 | 11/2005 | Augusto et al. | |
| 2006/0184473 A1 | 8/2006 | Eder | |
| 2008/0029840 A1 | 2/2008 | Forbes et al. | |
| 2008/0194075 A1 * | 8/2008 | Wu | 438/425 |
| 2008/0203484 A1 * | 8/2008 | Hofmann et al. | 257/369 |
| 2009/0111200 A1 | 4/2009 | Carothers et al. | |
| 2009/0299896 A1 | 12/2009 | Zhang et al. | |
| 2010/0059822 A1 | 3/2010 | Pinguet et al. | |
| 2010/0140708 A1 | 6/2010 | Hill et al. | |

(Continued)

OTHER PUBLICATIONS

Sherwood-Droz, et al., "Oxidized Silicon-on-Insulator (OxSOI) from Bulk Silicon: A New Photonic Platform," Optics Express 5786, Optical Society of America, Mar. 2010, vol. 18, No. 6, pp. 1-6.

(Continued)

*Primary Examiner* — David Vu
*Assistant Examiner* — Mouloucoulaye Inoussa
(74) *Attorney, Agent, or Firm* — Scully, Scott, Murphy & Presser, P.C.; Vazken Alexanian

(57) ABSTRACT

Photonic devices are created by laterally growing a semiconductor material (i.e., a localized semiconductor-on-insulator layer) over a localized buried oxide (BOX) created in a semiconductor by either a trench isolation process or thermal oxidation. In one embodiment, and after trench formation in a semiconductor substrate, the trench is filled with oxide to create a localized BOX. The top surface of the BOX is recessed to depth below the topmost surface of the semiconductor substrate to expose sidewall surfaces of the semiconductor substrate within each trench. A semiconductor material is then epitaxially grown from the exposed sidewall surfaces of the semiconductor substrate.

9 Claims, 13 Drawing Sheets

(56) References Cited

U.S. PATENT DOCUMENTS

2010/0258809 A1* 10/2010 Muller .......................... 257/66
2011/0027950 A1   2/2011 Jones et al.

OTHER PUBLICATIONS

Holzwarth, et al., "Localized Substrate Removal Technique Enabling Strong-Confinement Microphotonics in Bulk Si Cmos Processes," in Conference on Lasers and Electro-Optics/Quantum Electronics and Laser Science Conference and Photonic Applications Systems Technologies, OSA Technical Digest (CD), Optical Society of America, May 2008, pp. 1-2.

Ji, et al, "Bulk silicon photonic wire for one-chip integrated optical interconnection," Group IV Photonics (GFP), 2010 7th IEEE International Conference on Sep. 1-3, 2010, pp. 96-98.

Saenger, K. L., et al., "Mask-edge defects in hybrid orientation direct-Si-bonded substrates recrystallized by solid phase epitaxy after patterned amorphization", Journal of Applied Physics, Apr. 2007, 101, 084912.

Office Action dated Sep. 2, 2014 received in U.S. Appl. No. 12/690,339.

Office Action dated Feb. 17, 2015 received in related U.S. Appl. No. 13/667,389.

* cited by examiner

FABRICATION OF LOCALIZED SOI ON LOCALIZED THICK BOX USING SELECTIVE EPITAXY ON BULK SEMICONDUCTOR SUBSTRATES FOR PHOTONICS DEVICE INTEGRATION

CROSS REFERENCE TO RELATED APPLICATION

The present invention is related to the following commonly-owned, co-pending U.S. patent application Ser. No. 13/667,389, filed on Nov. 2, 2012, the entire content and disclosure of which is incorporated herein by reference.

BACKGROUND

The present disclosure relates to methods of fabricating a localized semiconductor-on-insulator (SOI) on a localized thick buried oxide (BOX) on a bulk semiconductor substrate for semiconductor photonic's device components, such as, for example, waveguides and modulators, integrated with bulk device technologies.

Photonic devices are useful as communication devices. Stand-alone photonic devices require an interface with optical fibers. A circuit including multiple photonic devices not only becomes bulky in size, but also economically disadvantageous. In order to fully utilize the functionalities of photonic devices, therefore, it is necessary to integrate photonic devices with other photonic devices and other types of devices such as semiconductor devices.

Integration of photonic devices with semiconductor devices such as complementary metal oxide semiconductor (CMOS) devices and/or bipolar complementary metal oxide semiconductor (BiCMOS) devices can provide on-chip and chip-to-chip optical interconnections. However, photonic devices and semiconductor devices can require different types of substrates. While many CMOS devices and BiCMOS devices require a bulk semiconductor substrate, many photonic devices require a semiconductor-on-insulator (SOI) substrate, which is more expensive than bulk substrates. Thus, there is a need to enable formation of such photonic devices and CMOS/BiCMOS devices on a same substrate in an economical manner.

SUMMARY

Photonic devices are created by laterally growing a semiconductor material (i.e., a localized SOI layer) over a localized buried oxide (BOX) created in a semiconductor by either a trench isolation process or thermal oxidation. In some embodiments of the present disclosure, and after trench formation in a semiconductor substrate, the trench is filled with an oxide to create a localized BOX. The top surface of the BOX is recessed to depth below the topmost surface of the semiconductor substrate to expose sidewall surfaces of the semiconductor substrate within each trench. A semiconductor material is then epitaxially grown, to form the localized SOI layer, from the exposed sidewall surfaces of the semiconductor substrate.

In one embodiment of the present disclosure, a first method of providing a photonic device is provided which includes providing a patterned material stack having at least one opening on an upper surface of a semiconductor substrate. Next, at least one trench is formed within the semiconductor substrate utilizing the patterned material stack as an etch mask. The at least one trench and the at least opening are then filled with an oxide. The oxide is then recessed below the upper surface of the semiconductor substrate to expose sidewall surfaces of the semiconductor substrate within the at least one trench. A semiconductor material is then epitaxially grown from the exposed sidewall surfaces. In accordance with the present disclosure, the semiconductor material that is epitaxially grown completely fills a remaining portion of the at least one trench and the at least one opening. Next, the patterned material stack and the semiconductor material present above the upper surface of the semiconductor substrate and within the at least one opening are removed.

In another embodiment of the present disclosure, a second method of providing a photonic device is provided which includes providing a patterned material stack having at least one opening on an upper surface of a semiconductor substrate. Next, at least one trench is formed within the semiconductor substrate utilizing the patterned material stack as an etch mask. A sacrificial nitride-containing spacer is then formed on each exposed sidewall of the patterned material stack and the semiconductor substrate. In accordance with the present disclosure, a base of the sacrificial nitride-containing spacer is present on an exposed surface of the semiconductor substrate within a bottom portion of the at least one trench. The exposed portion of the semiconductor substrate at the bottom portion of the at least one trench is then subjected to oxidation. The oxidation forms a semiconductor oxide region within the semiconductor substrate at the bottom portion of the at least one trench. The sacrificial nitride-containing spacer is then removed to expose sidewall surfaces of the semiconductor substrate within the at least one trench. A semiconductor material is then epitaxially grown from the exposed sidewall surfaces. In accordance with the present disclosure, the semiconductor material that is epitaxially formed completely fills a remaining portion of the at least one trench and the at least one opening. Next, the patterned material stack and the semiconductor material present above the upper surface of the semiconductor substrate and within the at least one opening are removed.

In yet another embodiment of the present disclosure, a third method of providing a photonic device is provided which includes providing a patterned material stack having at least one opening on an upper surface of a semiconductor substrate. Next, at least one trench is formed within the semiconductor substrate utilizing the patterned material stack as an etch mask. The at least one trench and the at least opening are then filled with an oxide. Next, the oxide from the at least one opening is removed utilizing an oxide recessed etch. The patterned material stack is then removed from the upper surface of the semiconductor substrate, while maintaining oxide within the at least one trench. A pair of recessed regions is then formed within the at least one trench. In accordance with the present disclosure and during the formation of the pair of recessed regions, an oxide pillar portion separates one of the recessed regions from another of the recessed regions and sidewall surfaces of the semiconductor substrate within the at least one trench are exposed. Next, semiconductor material is epitaxially grown from the exposed sidewall surfaces. In accordance with the present disclosure the semiconductor material completely fills each of the recessed regions. Next, the semiconductor material present above the upper surface of the semiconductor substrate is removed.

In a further embodiment of the present disclosure, a fourth method of providing a photonic device is provided which includes providing a patterned material stack having at least one opening on an upper surface of a semiconductor substrate. Next, at least one trench is formed within the semiconductor substrate utilizing the patterned material stack as an etch mask. Exposed surfaces of the semiconductor substrate within at least one trench are then oxidized. During the oxidation process, a semiconductor oxide region forms within the at least one trench. Next, the patterned material stack is removed from the upper surface of the semiconductor substrate. A pair of recessed regions is then formed within the semiconductor oxide region. In accordance with the present disclosure and during the formation of the pair of recessed regions, an oxide pillar portion separates one of the recessed regions from another of the recessed regions and sidewall surfaces of the semiconductor substrate are exposed. Next, semiconductor material is epitaxially grown from the exposed sidewall surfaces. In accordance with the present disclosure the semiconductor material completely fills each of the recessed regions. Next, the semiconductor material present above the upper surface of the semiconductor substrate is removed.

DETAILED DESCRIPTION

The present disclosure, which provides methods for fabricating a localized SOI layer on a localized thick buried oxide (BOX) on a bulk semiconductor substrate for semiconductor photonic's device components, such as, for example, waveguides and modulators, integrated with bulk device technologies such as, for example, CMOS, BiCMOS and DRAM (dynamic random access memory, will now be described in greater detail by referring to the following discussion and drawings that accompany the present application. It is noted that the drawings that accompany the present application are provided for illustrative purposes only, and, as such, these drawings are not drawn to scale.

In the following description, numerous specific details are set forth, such as particular structures, components, materials, dimensions, processing steps and techniques, in order to provide a thorough understanding of the present disclosure. However, it will be appreciated by one of ordinary skill in the art that the various embodiments of the present disclosure may be practiced without these specific details. In other instances, well-known materials, structures or processing steps have not been described in detail in order to avoid obscuring the present disclosure.

Figure 1:
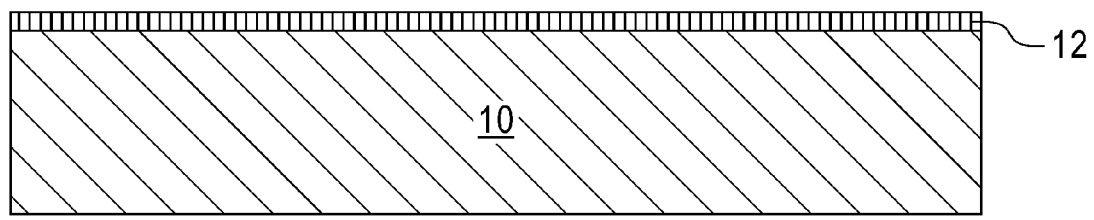
FIG. 1 is a vertical-cross sectional view illustrating a structure including a pad oxide located atop a semiconductor substrate that can be employed in one embodiment of the present disclosure.

Reference is now made to FIGS. 1-13 which illustrate one embodiment of the present disclosure. Referring to FIG. 1, there is illustrated a structure that can be employed in one embodiment of the present disclosure. The structure includes a pad oxide 12 located on an upper surface of semiconductor substrate 10.

The semiconductor substrate 10 can be a bulk semiconductor substrate having only a semiconductor material between a planar uppermost surface and a planar bottommost surface. In one embodiment, the semiconductor substrate 10 can include a same single crystalline semiconductor material throughout the entirety thereof.

The semiconductor substrate 10 includes a semiconductor material, which can be an elemental semiconductor material such as silicon, germanium, and carbon, an alloy of at least two elemental semiconductor materials such as a silicon-germanium alloy, a III-V compound semiconductor material, a II-VI compound semiconductor material, or an alloy or a stack thereof. For example, the entirety of the semiconductor substrate 10 can be a single crystalline silicon layer, a single crystalline silicon-germanium alloy layer, a single crystalline silicon-carbon alloy layer, or a single crystalline silicon-germanium-carbon alloy layer.

In one embodiment, the semiconductor substrate 10 can be a bulk single crystalline semiconductor substrate including at least one doped or undoped semiconductor material throughout the entirety thereof. The semiconductor substrate 10 can be undoped, have a homogeneous doping of p-type or n-type, or can have a plurality of doped semiconductor portions having different dopant concentrations and/or different conductivity types (i.e., p-type or n-type). The thickness of the semiconductor substrate 10 can be from 50 micron to 2 cm, although lesser and greater thicknesses can also be employed. In one embodiment of the present disclosure, the semiconductor substrate 10 is a bulk single crystalline silicon semiconductor substrate.

The pad oxide 12 that is present atop the semiconductor substrate 10 can be a semiconductor oxide material such as, for example, silicon oxide. The pad oxide 12 can be formed as a blanket layer, i.e., a contiguous layer having a same thickness throughout and not including any holes therein, on the upper surface of the semiconductor substrate 10. The pad oxide 12 can be formed by a thermal oxidation in which the semiconductor substrate 10 is exposed to an oxidizing ambient such as $O_2$ or air, at a temperature of 900° C. or greater. During exposure any upper portion of the semiconductor substrate 10 is converted into a semiconductor oxide. In some embodiments of the present disclosure, the pad oxide 12 can be formed by a deposition process such as, for example, chemical vapor deposition, and plasma enhanced chemical vapor deposition. The thickness of the pad oxide 12 can be from 4 nm to 10 nm, although lesser and greater thicknesses can also be employed.

Figure 2:
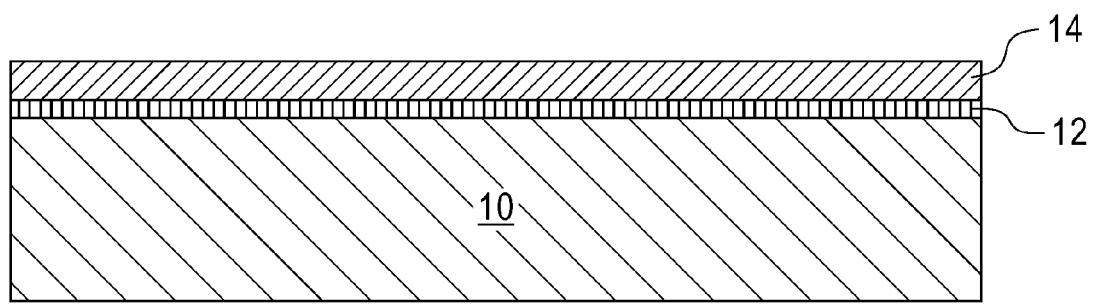
FIG. 2 is a vertical-cross sectional view illustrating the structure of FIG. 1 after forming an oxygen-impermeable layer atop the pad oxide.

Referring to FIG. 2, there is illustrated the structure of FIG. 1 after forming an oxygen-impermeable layer 14 on an exposed surface of the blanket layer of pad oxide 12. Collectively the pad oxide 12 and the oxygen-impermeable layer 14 can be referred to herein as a material stack. The oxygen-impermeable layer 14 can be formed as a blanket layer atop the blanket layer of pad oxide 12. As used herein, an "oxygen-impermeable" element is an element that is not permeable to oxygen. The oxygen-impermeable layer 14 includes at least an oxygen-impermeable material such as silicon nitride, a dielectric metallic nitride, or a conductive metallic nitride. In one embodiment, the oxygen-impermeable layer 14 includes silicon nitride. The oxygen-impermeable material of the oxygen-impermeable layer 14 can be in contact with the uppermost surface of the pad oxide 12.

In some embodiments of the present disclosure, the oxygen-impermeable layer 14 can further include an additional dielectric material layer in an upper portion thereof. The additional dielectric material layer that may be used can include, for example, undoped silicon oxide or doped silicon oxide.

The oxygen-impermeable layer 14 can be deposited, for example, by chemical vapor deposition (CVD) or atomic layer deposition (ALD). The thickness of the oxygen-impermeable layer 14 can be from 5 nm to 1,000 nm, although lesser and greater thicknesses can also be employed.

Figure 3:
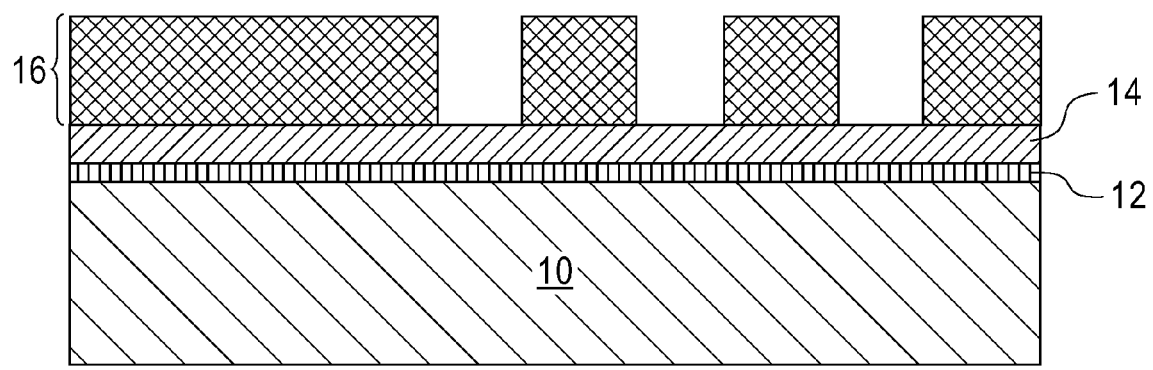
FIG. 3 is a vertical-cross sectional view illustrating the structure of FIG. 2 after forming a patterned photoresist atop the oxygen-impermeable layer.

Referring now to FIG. 3, there is illustrated the structure of FIG. 2 after forming a patterned photoresist 16 atop the oxygen-impermeable layer 14. The patterned photoresist 16 can be formed by first applying a photoresist material atop the oxygen-impermeable layer 14, and then subjecting the photoresist material to lithography which includes exposing the photoresist material to a desired pattern of radiation and developing the resist utilizing a conventional resist developer.

Figure 4:
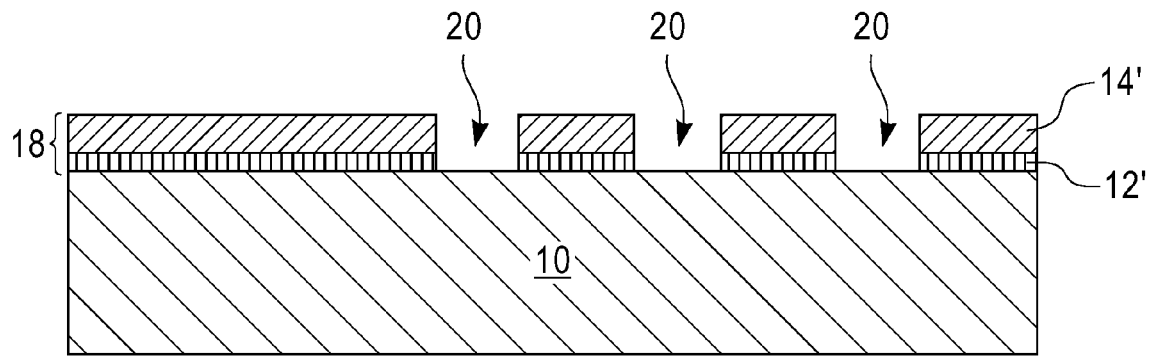
FIG. 4 is a vertical-cross sectional view illustrating the structure of FIG. 3 after transferring the pattern from the patterned photoresist into the oxygen-impermeable layer and pad oxide and stripping the patterned photoresist forming a patterned material stack atop the semiconductor substrate.

Referring to FIG. 4, there is illustrated the structure of FIG. 3 after transferring the pattern from the patterned photoresist 16 into the oxygen-impermeable layer 14 and pad oxide 12 and then stripping the patterned photoresist 16 so as to provide a patterned material stack 18 atop the semiconductor substrate 10. The transferring of the pattern from the patterned photoresist 16 into the oxygen-impermeable layer 14 and pad oxide 12 can be performed utilizing one or more etching steps. In one embodiment, a dry etch process such as, for example, reactive-ion etching, ion beam etching and/or laser etching can be employed in pattern transfer. In another embodiment, a chemical wet etch can be employed in pattern transfer. In yet another embodiment, a combination of a dry etch and a chemical wet etch can be used.

The pad material stack 18 includes remaining portions of the oxygen-impermeable layer 14' and remaining portions of the pad oxide 12'. The patterned material stack 18 also includes at least one opening 20 which exposes a portion of the semiconductor substrate 10. The at least one opening (or just "the opening" for short) 20 in the patterned material stack 18 can be formed in the pattern of a line cavity, i.e., a cavity having a greater dimension along a lengthwise direction than along a widthwise dimension. The vertical cross-sectional view of FIG. 4 is along the widthwise direction of parallel line cavities. In one embodiment, some of the line cavities can be parallel to one another.

The patterned photoresist 16 can be removed after a portion of the upper surface of the semiconductor substrate 10 is physically exposed at the bottom of the opening 20. The removal of the patterned photoresist 16 from the structure can be achieved utilizing a conventional resist stripping process such as, for example, ashing.

Figure 5:
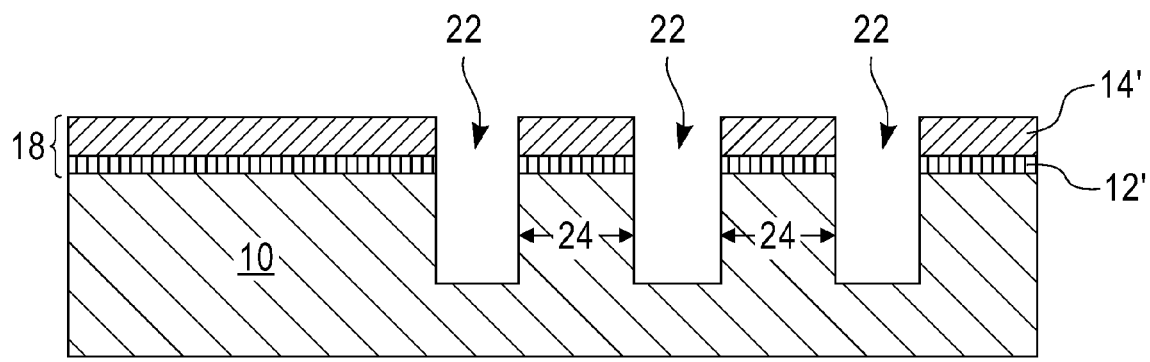
FIG. 5 is a vertical-cross sectional view illustrating the structure of FIG. 4 after forming a trench within the semiconductor substrate using the patterned material stack as an etch mask.

Referring to FIG. 5, there is illustrated the structure of FIG. 4 after forming at least one trench (or just "the trench" for short) 22 within the semiconductor substrate 10 using the patterned material stack 18 as an etch mask. That is, FIG. 5 shows the resultant structure that is formed after transferring the pattern of the opening 20 into an upper portion of the semiconductor substrate 10. In one embodiment, the trench 22 is formed by an isotropic etch. The anisotropic etch etches the semiconductor material of the semiconductor substrate 10 selective to the material of the patterned material stack 18.

The trench 22 that is formed into the upper portion of the semiconductor substrate 10 replicates the pattern of the opening 20 that is present in the patterned material stack 18. In one embodiment, the trench 22 can be a line trench. Each trench 22 has a depth d as measured from the upper surface of the semiconductor substrate 10 to the bottommost surface of the trench 22.

In one embodiment, a first trench and a second trench are laterally separated by a lateral distance ld through the patterned material stack 18 and the upper portion of the semiconductor substrate 10. A portion of the semiconductor substrate 10 between these two trenches has a width, which is the lateral distance ld between the two trenches 22. This portion of the semiconductor substrate 10 is herein referred to as a laterally isolated semiconductor material portion 24. In one embodiment, the lateral distance $1d$, i.e., the width of the laterally isolated semiconductor material portion 24, is less than the depth d of the two trenches 22. Each of the two trenches 22 laterally separates the laterally isolated semiconductor material portion 24 from the rest of the semiconductor substrate 10.

Each trench 22 can have a same first width w1, or a different first width w1 that varies from one trench to another trench. The first width w1 of each trench 22 can be, for example, in a range from 50 nm to 5,000 nm.

Figure 6:
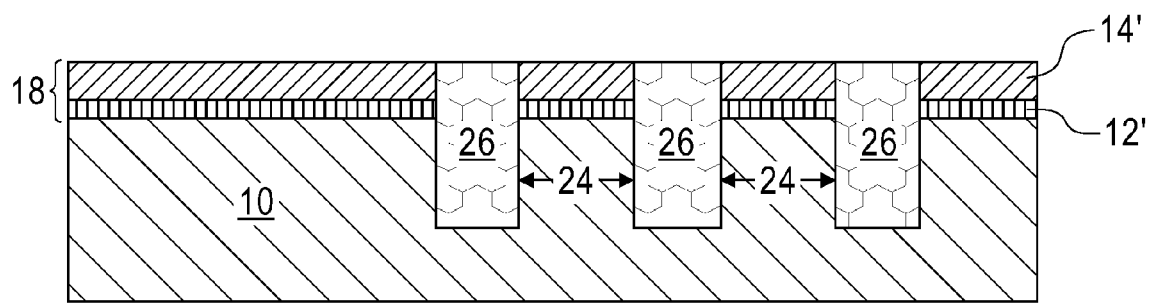
FIG. 6 is a vertical-cross sectional view illustrating the structure of FIG. 5 after filling the trench with an oxide and performing planarization.

Referring now to FIG. 6, there is illustrated the structure of FIG. 5 after filling each trench 22 and opening 20 with an oxide 26 and performing planarization. In one embodiment, the oxide 26 that is formed into the trench 22 and opening 20 can include a semiconductor oxide which includes a same semiconductor element(s) as the semiconductor material 10. In another embodiment, the oxide 26 that is formed into the trench 22 and opening 20 can include a semiconductor oxide which includes at least one different semiconductor element as that of the semiconductor substrate 10. Typically, the oxide 26 is silicon oxide. The oxide 26 can be formed utilizing a deposition process such as, for example, chemical vapor deposition (CVD). Excess oxide above the outside the opening 20 and on an uppermost surface of the patterned material stack 18 can be removed by planarization. In one embodiment, the planarization process may include chemical mechanical polishing.

Figure 7:
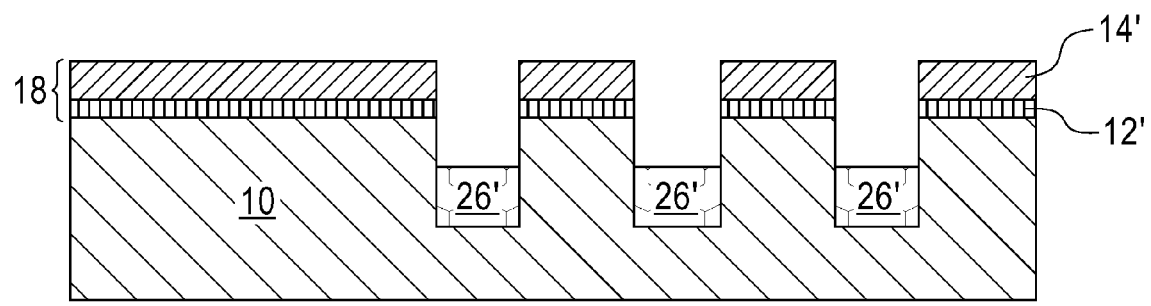
FIG. 7 is a vertical-cross sectional view illustrating the structure of FIG. 6 after recessing the oxide that was formed in the trench below the uppermost surface of the semiconductor substrate.

Referring to FIG. 7, there is illustrated the structure of FIG. 6 after recessing the oxide 26 that is within the opening 20 and the trench 22 below the upper surface of the semiconductor substrate 10. The remaining oxide 26' within each trench 22 will subsequently become a buried oxide (BOX) of the structure. In one embodiment, the oxide 26 can be recessed utilizing a timed controlled reactive ion etching process. The remaining oxide 26' has a thickness which is sufficient to keep light trapped within a SOI layer to be subsequently formed. Typically, the remaining oxide 26' has a thickness from 1 micron to 3 microns.

Figure 8:
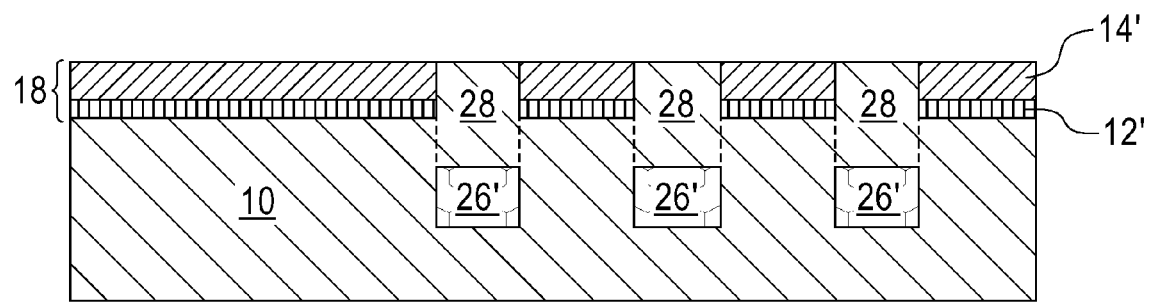
FIG. 8 is a vertical-cross sectional view illustrating the structure of FIG. 7 after epitaxially growing a semiconductor material from physically exposed sidewall surfaces of the semiconductor substrate within the trench.

Referring to FIG. 8, there is illustrated the structure of FIG. 7 after epitaxially growing a semiconductor material 28 from physically exposed sidewall surfaces of the semiconductor substrate 10 within each trench 22. In this embodiment of the present disclosure, semiconductor material portions (not shown) of the semiconductor material 28 grow inward and outward from each physically exposed sidewall surface of the semiconductor substrate 10 within each trench 22 and converge above the remaining oxide 26'. During the epitaxial growth process, the semiconductor material 28 fills the space which is present between the adjacent patterned material stacks 18 providing the structure such as shown in FIG. 8. In some embodiments, a planarization process can be used to remove any excess semiconductor material that forms atop the patterned material stack 18. In the present drawings that accompanying the present disclosure, dotted lines are used to represent that no physical interface exists between the sidewall surfaces of the semiconductor substrate and the semiconductor material that is grown by epitaxial deposition.

"Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. In the present embodiment, the semiconductor material 28 has the same crystalline characteristics as that of the physically exposed sidewall surfaces of the semiconductor substrate 10. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. In some embodiments, the epitaxial deposition process is a selective deposition process.

The semiconductor material 28 that can be epitaxially deposited includes any semiconductor material such as, for example, silicon (Si), germanium (Ge), and silicon germanium (SiGe). In one embodiment, the semiconductor material 28 includes a same semiconductor material as that of the semiconductor substrate 10. In another embodiment, the semiconductor material 28 includes a different semiconductor material as that of the semiconductor substrate 10. It is noted that the specific material compositions for the semiconductor material 28 are provided for illustrative purposes only, and are not intended to limit the present disclosure, as any semiconductor material that may be formed using an epitaxial growth process.

A number of different sources may be used for the deposition of semiconductor material 28. In some embodiments, in which the semiconductor material 28 is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which semiconductor material 28 is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material 28 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The temperature for epitaxial semiconductor deposition typically ranges from 550° C. to 900° C. Although higher temperature typically results in faster deposition, the faster deposition may result in crystal defects and film cracking. The apparatus for performing the epitaxial growth may include a chemical vapor deposition (CVD) apparatus, such as atmospheric pressure CVD (APCVD), low pressure CVD (LPCVD), plasma enhanced CVD (PECVD), metal-organic CVD (MOCVD) and others. The epitaxial semiconductor material that is deposited can be doped or undoped. By "undoped" it is meant that the maximum dopant concentration of p-type or n-type dopants that are present in the epitaxial semiconductor material is less than $5 \times 10^{17}$ atoms/cm$^3$.

Figure 9:
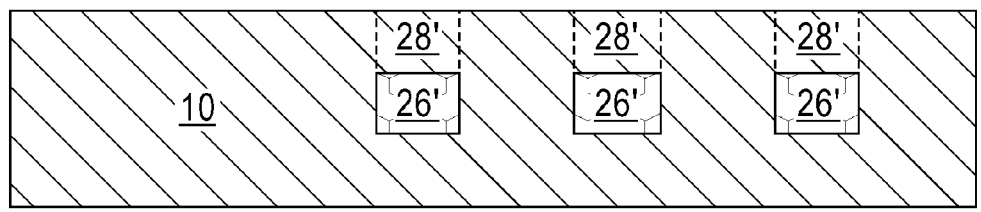
FIG. 9 is a vertical-cross sectional view illustrating the structure of FIG. 8 after removing the patterned material stack from atop the semiconductor substrate and planarization of localized SOI layer.

Referring now to FIG. 9, there is illustrated the structure of FIG. 8 after removing the patterned material stack 18 from the upper surface of the semiconductor substrate 10. Before, during, or after the removal of the patterned material stack 18 from the structure, a portion of the semiconductor material 28 that is located above the upper surface of semiconductor substrate 10 and between adjacent patterned material stack portions can also be removed. The remaining portion of the semiconductor material 28 that is located between the physically exposed sidewall surfaces of the semiconductor substrate 10 and above the remaining oxide 26' can be referred to herein as a photonic SOI layer 28'.

In some embodiments of the present disclosure, the patterned material stack 18 and the portion of the semiconductor material 28 between adjacent patterned material stack portions can be removed in a single step utilizing, for example, planarization. The single step planarization process can include, for example, chemical mechanical polishing and/or grinding. In other embodiments, the patterned material stack 18 can be removed prior to removing the portion of the semiconductor material 28. In such an embodiment, one or more dry etching and/or chemical wet etching processes can be used to remove the patterned material stack 18, followed by chemical mechanical polishing which removes the portion of the semiconductor material 28 that was previously located between adjacent patterned material stack portions.

The resultant structure illustrated, for example, in FIG. 9, is planar. That is, an uppermost surface of the photonic SOI layer 28' is coplanar to the uppermost surface of the semiconductor substrate 10. As shown, each photonic SOI layer 28' is positioned above the remaining oxide 26' that is left within each trench 22.

Figure 10:
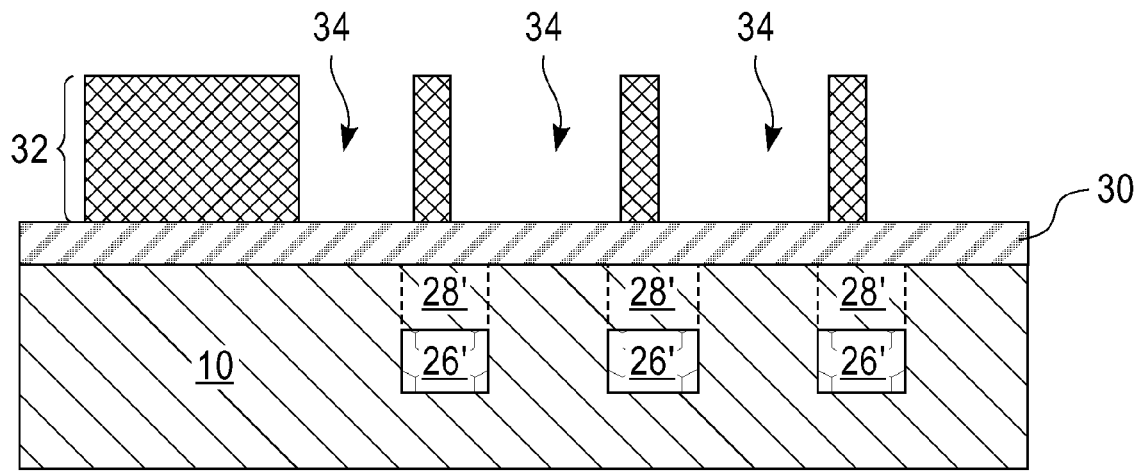
FIG. 10 is a vertical-cross sectional view illustrating the structure of FIG. 9 after formation of another oxygen-impermeable layer and another patterned photoresist atop the semiconductor substrate.

Referring now to FIG. 10, there is illustrated the structure of FIG. 9 after formation of another oxygen-impermeable layer 30 and another patterned photoresist 32 atop the semiconductor substrate 10. As shown, a bottommost surface of the oxygen-impermeable layer 30 directly contacts the upper surface of the photonic SOI layer 28' and the upper surface of the semiconductor substrate 10. Also, and as shown in FIG. 10, the another patterned photoresist 32 includes trench patterns 34 formed therein.

The another oxygen-impermeable layer 30 can include one of the materials mentioned above for the oxygen-impermeable layer 14. In one embodiment, the another oxygen-impermeable layer 30 comprises silicon nitride. The another oxygen-impermeable layer 30 that is employed in this embodiment of the present disclosure can be formed utilizing one of the deposition processes mentioned above for oxygen-impermeable layer 14. Also, the another oxygen-impermeable layer 30 can have a thickness within the range mentioned above for oxygen-impermeable layer 14.

The another patterned photoresist 32 can be formed by first applying a blanket layer of photoresist material to an exposed surface of the another oxygen-impermeable layer 30. Next, the blanket layer of photoresist material is patterned by lithography.

Figure 11:
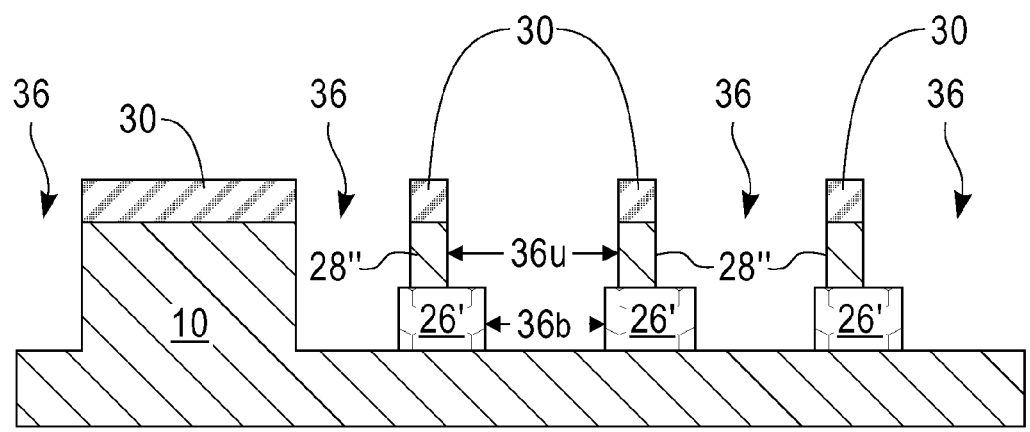
FIG. 11 is a vertical-cross sectional view illustrating the structure of FIG. 10 after formation of isolation trenches within the semiconductor substrate and stripping of the another patterned photoresist.

Referring to FIG. 11, there is illustrated the structure of FIG. 10 after formation of isolation trenches 36 within the semiconductor substrate 10 and stripping of the another patterned photoresist 32. The isolation trenches 36 can be formed by transferring the trench patterns 34 of the another patterned photoresist 32 into the another oxygen-impermeable layer 30 and then into the semiconductor substrate 10. In some instances, a portion of the photonic SOI layer 28' can also be removed during the pattern transfer process. The remaining photonic SOI layer, which is labeled as element 28" in FIG. 11, has a reduced width as compared to the width of the photonic SOI layer 28'. Also, the reduced width of the remaining photonic SOI layer 28" is less than the width of the remaining oxide 26'.

In accordance with an embodiment of the present disclosure, the transferring of the trench patterns 34 of the another patterned photoresist 32 can be performed utilizing an etching process such as, for example, reactive ion etching. In some embodiments, the trench patterns 34 can be transferred into the another oxygen-impermeable layer 30 utilizing a first etching process, then the another patterned photoresist 32 is removed by utilizing a conventional resist stripping process, such as, for example ashing, and thereafter, the trench pattern 36 formed into the another oxygen-impermeable layer 30 can be transferred into the semiconductor substrate 10 utilizing a second etching process that differs from the first etching process. In some instances, the another patterned photoresist remains on the structure after the first etch, and is then removed from the structure following the second etch.

As shown, some of the isolation trenches 36 are of variable widths having for example, a bottom portion 36b of a first width, and an upper portion 36u of a second width, wherein the first width is less than the second width. The bottom portion 36b of isolation trenches 26 of variable widths have at least one sidewall defined by the remaining photonic layer 28".

Figure 12:
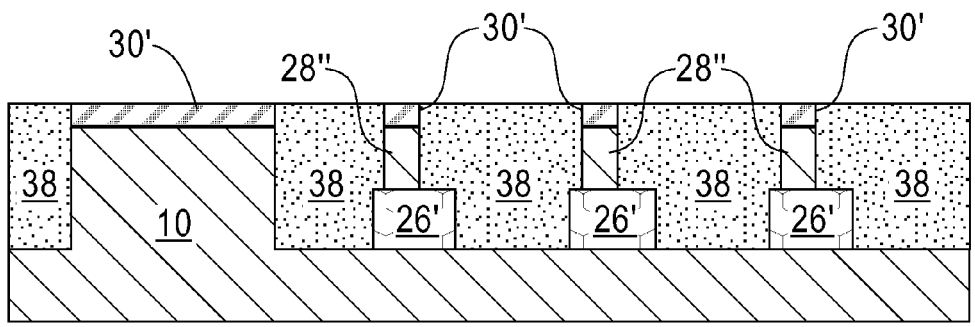
FIG. 12 is a vertical-cross sectional view illustrating the structure of FIG. 11 after filling the isolation trenches with a dielectric oxide and planarization.

Referring now to FIG. 12, there is illustrated the structure of FIG. 11 after filling the isolation trenches 36 with a dielectric oxide and planarization. The planarized and dielectric oxide filled trenches are herein referred to as isolation trenches 38.

The filling of the isolation trenches 36 with dielectric oxide may comprise any conventional deposition process such, as for example, chemical vapor deposition. The dielectric oxide can include any conventional oxide material including, for example, silicon oxide.

After filling of the isolation trenches 38 with the dielectric oxide, the structure is subjected to a planarization process such as, for example, chemical mechanical polishing and/or grinding. In the embodiment illustrated by FIG. 12, the planarization process stops on an uppermost surface of the another oxygen-impermeable layer 30.

At this point of the present disclosure, another planarization process can be performed to remove the remaining portions of the oxygen-impermeable layer 30, and thereafter bulk semiconductor devices such as, for example, complementary metal oxide semiconductor devices, i.e., transistors, can be formed. The structure that is formed after forming these bulk semiconductor devices is shown, for example, in FIG. 13.

Figure 13:
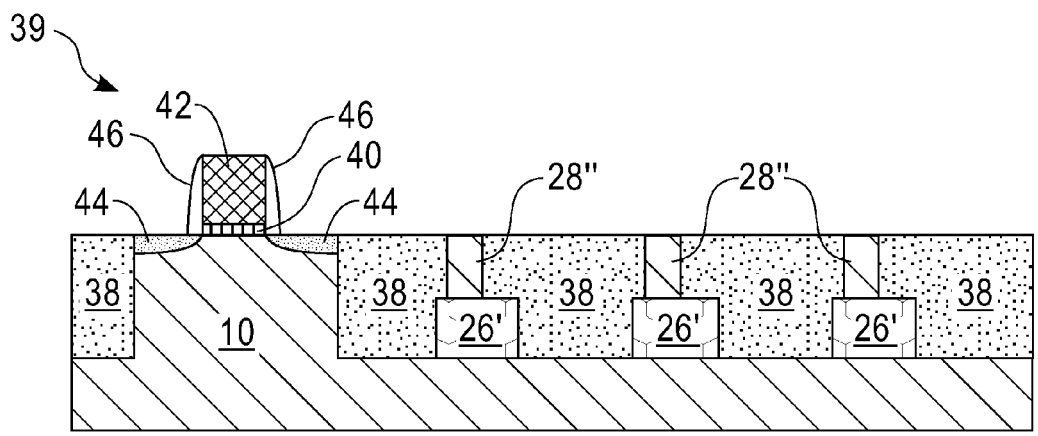
FIG. 13 is a vertical-cross sectional view illustrating the structure of FIG. 12 after formation of a bulk semiconductor device on an exposed semiconductor material portion of the semiconductor substrate.

Specifically, FIG. 13 illustrates the structure of FIG. 12 after formation of a bulk semiconductor device 39 on an exposed semiconductor material portion of the semiconductor substrate 10. FIG. 13 exemplifies the bulk semiconductor device as a transistor. Although a transistor is disclosed and illustrated as the bulk semiconductor device, the present disclosure is not limited to only such a bulk semiconductor device. Instead, other bulk semiconductor devices such as, for example, a SiGe heterobipolar transistor and/or a dynamic random access memory (DRAM) can also be formed.

In the illustrated embodiment, the transistor includes at least a gate dielectric 40 and a gate electrode 42 located on an exposed semiconductor surface of the semiconductor substrate 10. The transistor also includes a source region and a drain region collectively referred to herein as a source/drain regions 44 located within a semiconductor portion of the semiconductor substrate 10 and located at a footprint of the gate dielectric 40 and the gate electrode 42. The transistor can also include a dielectric spacer 46 located on an exposed sidewall surface of at least the gate electrode 42.

The gate dielectric 40 can be comprised of a semiconductor oxide, semiconductor nitride, semiconductor oxynitride, or any multilayered stack thereof. In one embodiment, the gate dielectric 40 is comprised of a semiconductor oxide such as, for example, silicon oxide. The gate dielectric 40 can also be comprised of a dielectric metal oxide having a dielectric constant that is greater than the dielectric constant of silicon oxide, e.g., 3.9. In one embodiment, the gate dielectric 40 comprises a dielectric oxide having a dielectric constant greater than 4.0. In another embodiment, the gate dielectric 40 can be comprised of a dielectric oxide having a dielectric constant of greater than 8.0. Exemplary dielectric oxide materials which have a dielectric constant of greater than 3.9 include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In some embodiments, multilayered stacks of at least two of the above mentioned dielectric materials can be employed. For example the gate dielectric 40 can include stack of, from bottom to top, silicon oxide and a hafnium oxide.

The thickness of the gate dielectric 40 may vary depending on the technique used to form the same. Typically, and in one embodiment, the gate dielectric 40 has a thickness from 0.5 nm to 10 nm. In another embodiment, the gate dielectric 40 has a thickness from 1.0 nm to 5 nm. In yet other embodiments of the present disclosure, the gate dielectric 40 may have an effective oxide thickness on the order of, or less than, 2 nm.

The gate dielectric 40 can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes. Alternatively, the gate dielectric 40 can be formed utilizing a thermal process such as, for example thermal oxidation or thermal nitridation.

The gate electrode 42 can comprise any conductive metal-containing material including, but not limited to, doped polysilicon, doped SiGe, an elemental metal, (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayers thereof. In one embodiment, the gate electrode 42 is comprised of nFET metal. In another embodiment, the gate electrode 42 is comprised of a pFET metal. In a further embodiment, the gate electrode 42 is comprised of TiN. In some embodiments, the gate electrode 42 includes, from bottom to top, a conductive metal and doped polysilicon.

The gate electrode 42 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When a metal silicide is formed, a conventional silicidation process can be employed. When a Si-containing material is employed as the gate electrode 42, a non-doped Si-containing layer can be formed and thereafter introducing a dopant into the non-doped Si-containing layer by utilizing one of ion implantation, gas phase doping, or by transferring a dopant from a sacrificial material layer formed in proximity of the non-doped Si-containing layer, and then removing the sacrificial layer from the structure. Alternatively, a doped Si-containing layer can be formed utilizing an in-situ doping deposition process.

The transistor can be formed utilizing any conventional process including, for example, a gate first or a gate last, i.e., replacement gate process. So as not to obscure the present disclosure, the details of such processes are not described herein.

The source/drain regions 44 can be formed utilizing any conventional ion implantation process. The source/drain regions include n-type dopants or p-type dopants as is well known to one skilled in the art. The dielectric spacer 46 can be comprised of a dielectric oxide, such as for example, silicon oxide, and/or an oxygen-impermeable dielectric material such silicon nitride, or a dielectric metallic nitride. The dielectric spacer 46 can be formed by deposition, followed by etching.

Figure 14:
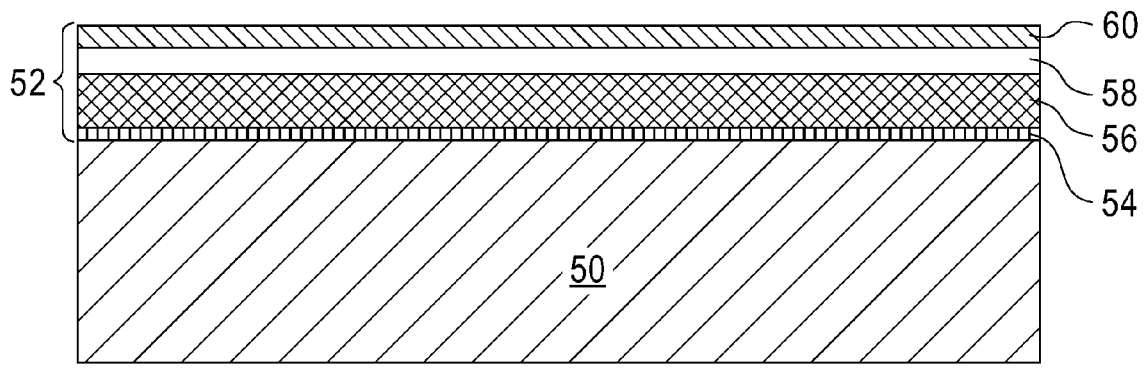
FIG. 14 is a vertical-cross sectional view illustrating a structure including a material stack located atop a semiconductor substrate that can be employed in another embodiment of the present disclosure.

Reference is now made to FIGS. 14-22 which illustrate a second embodiment of the present disclosure. The second embodiment of the present disclosure begins by first providing the structure shown, for example, in FIG. 14. Specifically, FIG. 14 illustrates a structure including a material stack 52 located on an upper surface of semiconductor substrate 50.

The semiconductor substrate 50 that is employed in this embodiment of the present disclosure is the same as semiconductor substrate 10 utilized in the first embodiment of the present disclosure. As such, the description for semiconductor substrate 10 can also be used herein to describe semiconductor substrate 50.

The material stack 52 includes, from bottom to top, a first pad oxide 54, a first oxygen-impermeable layer 56 located on an exposed surface of the first pad oxide 54, a second pad oxide 58 located on an exposed surface of the first oxygen-impermeable layer 56, and a second oxygen-impermeable layer 60 located on an exposed surface of the second pad oxide 58.

In one embodiment, the first pad oxide 54 and the second pad oxide 58 may comprise a same pad oxide material. In another embodiment, the first pad oxide 54 and the second pad oxide 58 may comprise a different pad oxide material. Notwithstanding which embodiment is employed in the present disclosure, the first pad oxide 54 and the second pad oxide 58 can be comprised of a semiconductor oxide material such as described above for pad oxide 12. The first pad oxide 54 and the second pad oxide 58 can be formed utilizing one of the techniques mentioned above in forming the pad oxide 12. The first pad oxide 54 has a thickness which is typically less than the thickness of the second pad oxide 58.

In one embodiment, the first oxygen-impermeable layer 56 and the second oxygen-impermeable layer 60 may comprise a same material. In another embodiment, the first oxygen-impermeable layer 56 and the second oxygen-impermeable layer 60 may comprise a different material. Notwithstanding which embodiment is employed in the present disclosure, the first oxygen-impermeable layer 56 and the second oxygen-impermeable layer 60 can be comprised of one of the oxygen-impermeable materials mentioned above for oxygen-impermeable layer 14. The first oxygen-impermeable layer 56 and the second oxygen-permeable layer 60 can be formed utilizing one of the techniques mentioned above in forming the oxygen-impermeable layer 14.

Figure 15:
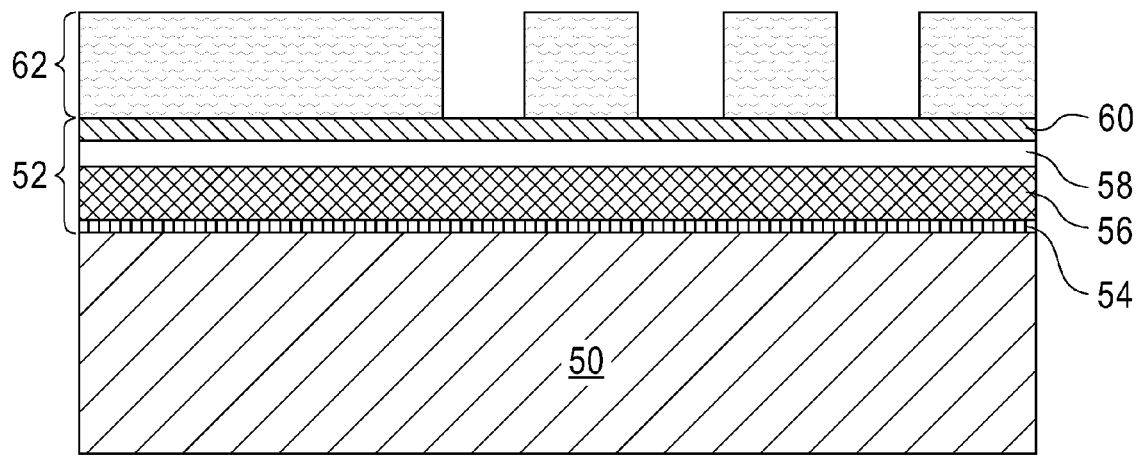
FIG. 15 is a vertical-cross sectional view illustrating the structure of FIG. 14 after forming a patterned photoresist atop the uppermost surface of the material stack.

Referring now to FIG. 15, there is illustrated the structure of FIG. 14 after forming a patterned photoresist 62 atop the uppermost surface of the material stack 52. The patterned photoresist 62 can be formed utilizing the same technique as mentioned above for forming patterned photoresist 16.

Figure 16:
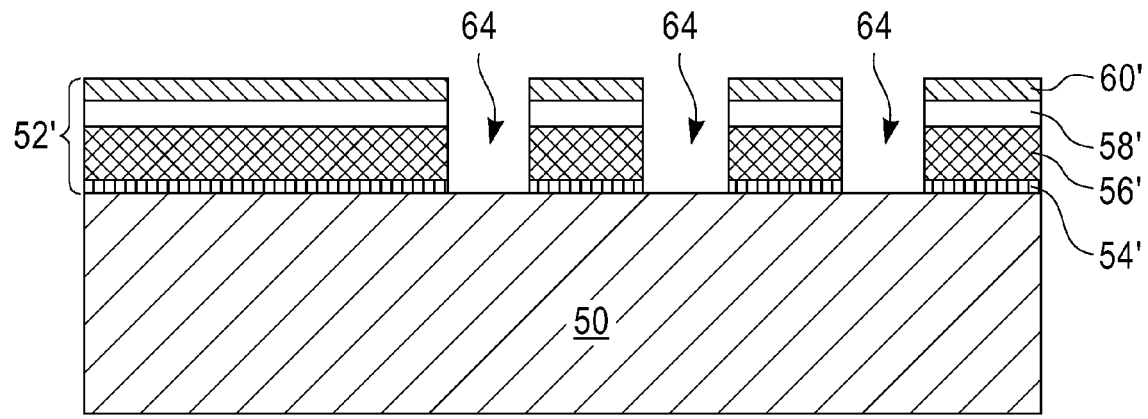
FIG. 16 is a vertical-cross sectional view illustrating the structure of FIG. 15 after transferring the pattern from the patterned photoresist into the material stack and stripping the patterned photoresist from the structure.

Referring now to FIG. 16, there is illustrated the structure of FIG. 15 after transferring the pattern from the patterned photoresist 62 into the material stack 52 and stripping the patterned photoresist 62 from the structure. The resultant structure now includes a patterned material stack 52' atop the semiconductor substrate 50. The transferring of the pattern from the patterned photoresist 62 into the material stack 52 can be performed utilizing one or more etching steps. In one embodiment, a dry etch process such as, for example, reactive-ion etching, ion beam etching and/or laser etching can be employed in pattern transfer. In another embodiment, a chemical wet etch can be employed in pattern transfer. In yet another embodiment, a combination of a dry etch and a chemical wet etch can be used.

The patterned material stack 52' includes remaining portions of the first and second oxygen-impermeable layers, labeled as elements 56' and 60' respectively, and remaining portions of the first and second pad oxides, labeled as 54' and 58', respectively. The patterned material stack 52' also includes at least one (herein after just "the opening") opening which exposes portions of the semiconductor substrate 50. The opening 64 in the patterned material stack 52' can be formed in the pattern of a line cavity, i.e., a cavity having a greater dimension along a lengthwise direction that along a widthwise dimension. The vertical cross-sectional view of FIG. 16 is along the widthwise direction of parallel line cavities. In one embodiment, some of the line cavities can be parallel to one another.

The patterned photoresist 62 can be removed after an uppermost surface of the semiconductor substrate 50 is physically exposed at the bottom of the opening 64. The removal of the patterned photoresist 62 from the structure can be achieved utilizing a conventional resist stripping process such as, for example, ashing.

Figure 17:
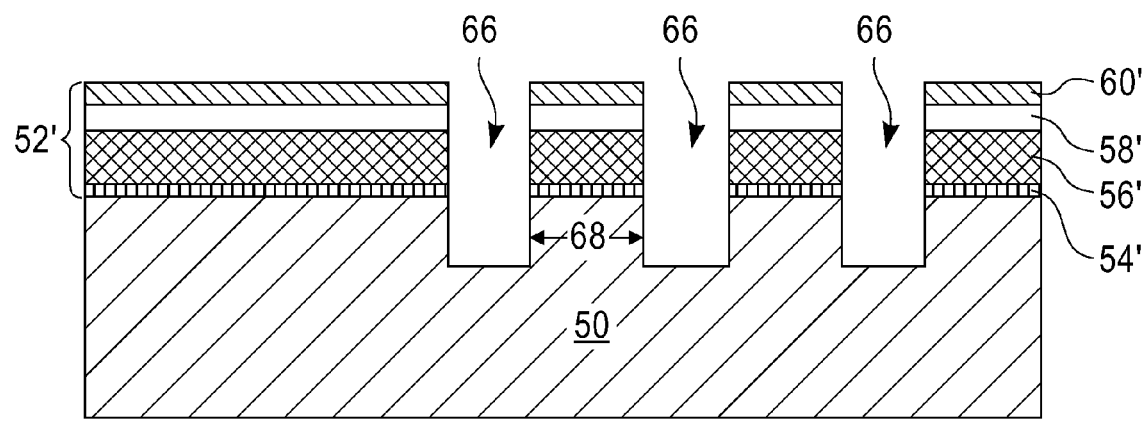
FIG. 17 is a vertical-cross sectional view illustrating the structure of FIG. 16 after forming a trench within the semiconductor substrate utilizing the patterned material stack as an etch mask.

Referring to FIG. 17, there is illustrated the structure of FIG. 16 after forming at least one trench (hereinafter just "the trench") 66 within the semiconductor substrate 50 utilizing the patterned material stack 52' as an etch mask. That is, FIG. 17 shows the resultant structure that is formed after transferring the pattern of the opening 64 into an upper portion of the semiconductor substrate 50. In one embodiment, the trench 66 is formed by an isotropic etch. The anisotropic etch etches the semiconductor material of the semiconductor substrate 50 selective to the various materials of the patterned material stack 52'.

The trench 66 that is formed into the upper portion of the semiconductor substrate 50 replicates the pattern of the opening 64 that is present in the patterned material stack 52'. In one embodiment, the trench 66 can be a line trench. Each trench 66 has a depth d as measured from the uppermost surface of the semiconductor substrate 50 to the bottommost surface of the trench 66.

In one embodiment, a first trench and a second trench are laterally separated by a lateral distance ld through the patterned material stack 52' and the upper portion of the semiconductor substrate 50. A portion of the semiconductor substrate 50 between the two trenches 66 has a width, which is the lateral distance ld between the two trenches 66. This portion of the semiconductor substrate 50 is herein referred to as a laterally isolated semiconductor material portion 68. In one embodiment, the lateral distance ld, i.e., the width of the laterally isolated semiconductor material portion 68, is less than the depth d of the two trenches 66. Each of the two trenches 66 laterally separates the laterally isolated semiconductor material portion 68 from the rest of the semiconductor substrate 50.

Each trench 66 can have a same first width w1, or a different first width w1 that varies from one trench to another trench. The first width w1 of each trench 66 can be, for example, in a range from 50 nm to 5,000 nm.

Figure 18:
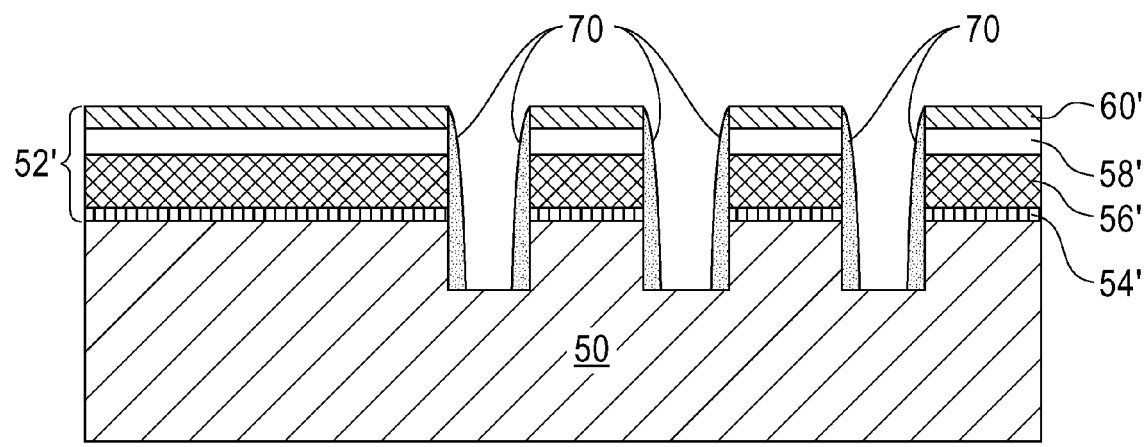
FIG. 18 is a vertical-cross sectional view illustrating the structure of FIG. 17 after forming a sacrificial nitride-containing spacer within the trench and along exposed sidewalls of the semiconductor substrate and the patterned material stack.

Referring to FIG. 18, there is illustrated the structure of FIG. 17 after forming a sacrificial nitride-containing spacer 70 within each trench 66 and along exposed sidewalls of the semiconductor substrate 50 and the patterned material stack 52'. Each sacrificial nitride-containing spacer 70 that is formed has a base that is located on an exposed portion of the semiconductor substrate 10 within trench 66. Each sacrificial nitride-containing spacer 70 can be comprised of a semiconductor nitride, such as, for example, silicon nitride, or a dielectric metallic nitride. Each sacrificial nitride-containing spacer 70 can be formed by deposition and etching.

Figure 19:
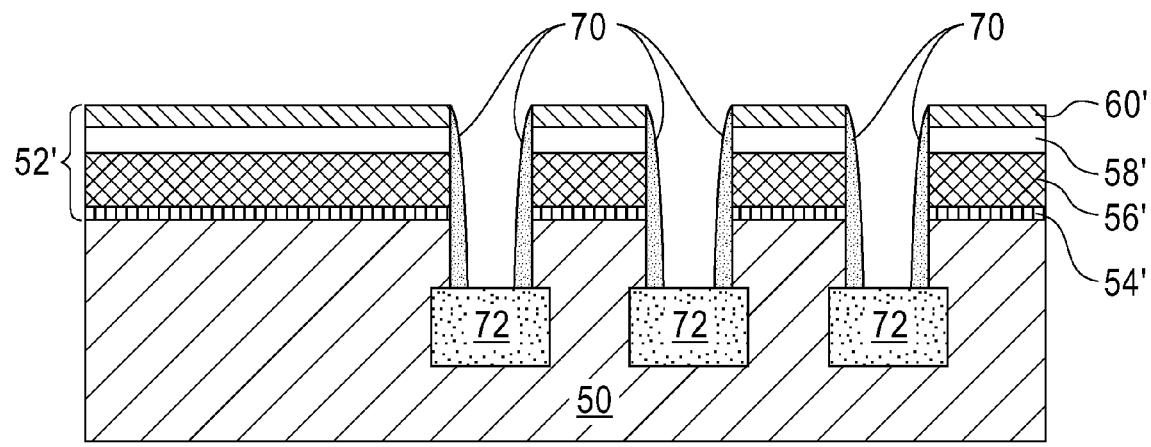
FIG. 19 is a vertical-cross sectional view illustrating the structure of FIG. 18 after oxidizing exposed portions of the semiconductor substrate within the trench and not protected by the sacrificial nitride-containing spacer.

Referring now to FIG. 19, there is illustrated the structure of FIG. 18 after oxidizing exposed portions of the semiconductor substrate 50 within a bottom portion of each trench 66 and not protected by the sacrificial nitride-containing spacer

70. The oxidizing forms a semiconductor oxide region 72 within the exposed portion of the semiconductor substrate 50 defined by trenches 66. Semiconductor oxide region 72 can also be referred to herein as a BOX region. The oxidizing comprises a thermal oxidation process which is performed at a temperature which is capable of converting the exposed portions of semiconductor substrate 50 into a semiconductor oxide material. In one embodiment, the temperature of the oxidizing is from 900° C. to 1100° C.

Each semiconductor oxide region 72 that is formed at this point of the present disclosure has a width that is equal to or greater than the width of the corresponding trench 66. The depth that each semiconductor oxide region 72 extends from the exposed surfaces of the semiconductor substrate 50 defined by the trenches 66 various depending on the conditions of the oxidizing process.

Figure 20:
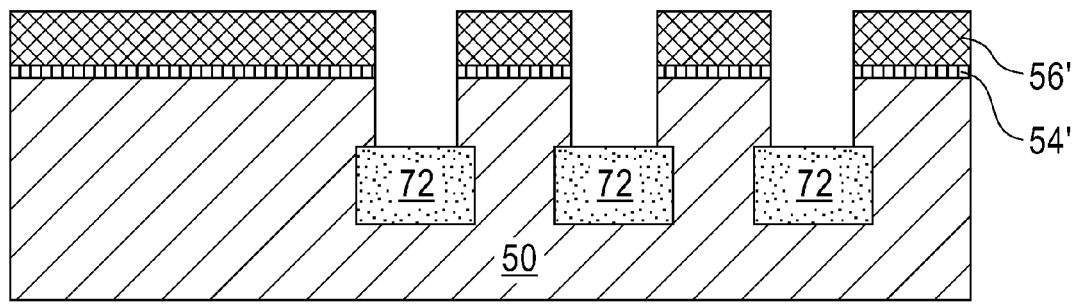
FIG. 20 is a vertical-cross sectional view illustrating the structure of FIG. 19 after removing the sacrificial nitride-containing spacer and an upper portion of the patterned material stack.

Referring to FIG. 20, there is illustrated the structure of FIG. 19 after removing the sacrificial nitride-containing spacer 70 from each trench 66 and an upper portion of the patterned material stack 52' including the remaining portions of the second oxygen-impermeable layer 60' and the remaining portion of the second pad oxide 58'. The removal of the sacrificial nitride-containing spacer 70 can be performed utilizing a chemical wet etch process that selectively removes the sacrificial nitride-containing spacer 70 relative to oxide material. During this removal, the remaining portions of the second oxygen-impermeable layer 60' are also removed. The remaining portion of the second pad oxide 58' is removed by a planarization process, such as, for example chemical mechanical polishing and/or grinding. This planarization process stops on an uppermost surface of the remaining portion of the first oxygen-impermeable layer 56'.

Figure 21:
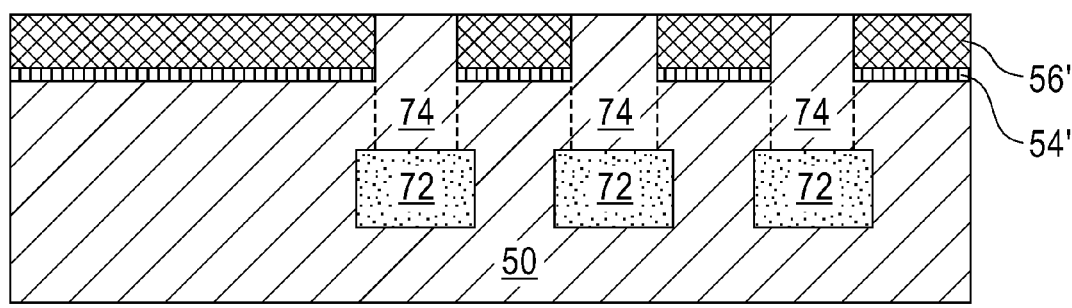
FIG. 21 is a vertical-cross sectional view illustrating the structure of FIG. 20 after epitaxially growing a semiconductor material from physically exposed sidewall surfaces of the semiconductor substrate within the trench.

Referring to FIG. 21, there is illustrated the structure of FIG. 20 after epitaxially growing a semiconductor material 74 from physically exposed sidewall surfaces of the semiconductor substrate 50 within each trench 66. The epitaxially growing of semiconductor material 74 includes the same technique mentioned above for epitaxially growing of semiconductor material 28. Semiconductor material 74 also includes one of the semiconductor materials mentioned above for semiconductor material 28.

Figure 22:
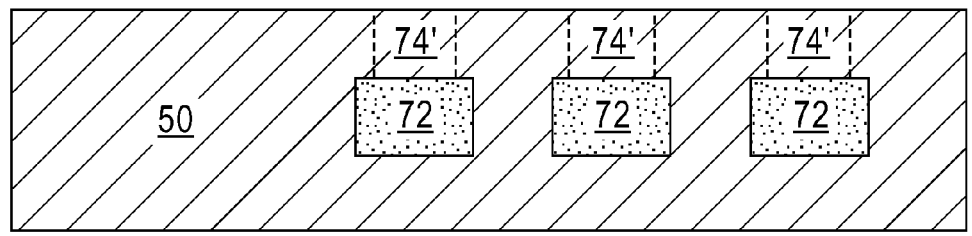
FIG. 22 is a vertical-cross sectional view illustrating the structure of FIG. 21 after removing a remaining lower portion of the patterned material stack from atop the semiconductor substrate and planarization of localized SOI layer.
Figure 23:
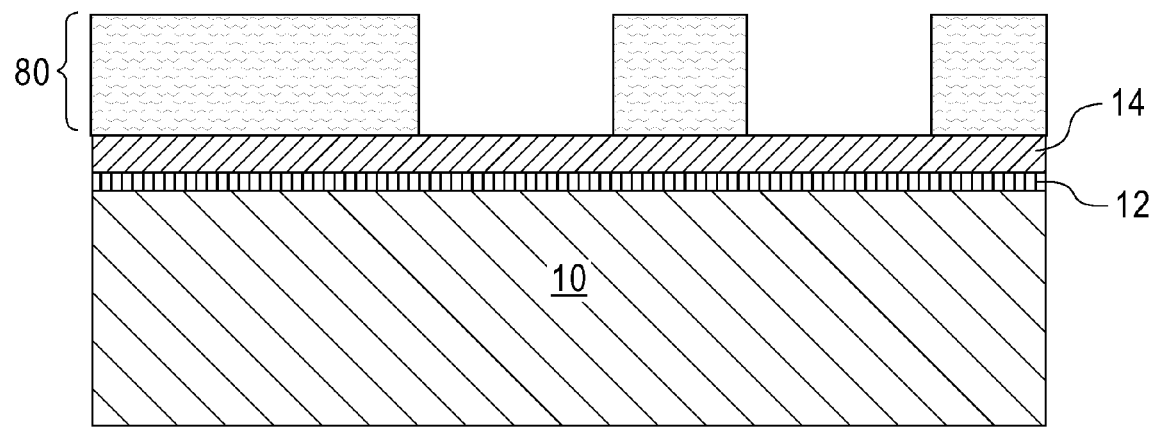
FIG. 23 is a vertical-cross sectional view illustrating the structure of FIG. 2 after forming a patterned photoresist atop the oxygen-impermeable layer in accordance with yet another embodiment of the present disclosure.

Referring now to FIG. 22, there is illustrated the structure of FIG. 21 after removing the remaining lower portions of the patterned material stack 52' (including the remaining portions of the first oxygen-impermeable layer 56' and the remaining portions of the first pad oxide 54') from atop the semiconductor substrate 50. Also, a portion of the semiconductor material 74 that is located between the remaining portions of the first oxygen-impermeable layer 56' and the remaining portions of the first pad oxide 54' can be concurrently removed at this point of the present process. The remaining portion of the semiconductor material 74 that is located between the physically exposed sidewall surfaces of the semiconductor substrate 50 and above each semiconductor oxide region 72 can be referred to herein as a photonic SOI layer 74'.

In some embodiments of the present disclosure, the remaining lower portions of the patterned material stack 52' and the portion of the semiconductor layer 72 between adjacent patterned material stack portions can be removed in a single step utilizing, for example, by planarization. The single step planarization process can include, for example, chemical mechanical polishing and/or grinding. In other embodiments, the remaining portions of the patterned material stack 52' can be removed prior to removing the portion of the semiconductor material 74. In such an embodiment, one or more dry etching and/or chemical wet etching processes can be used to the remaining portions of the patterned material stack 52', followed by chemical mechanical polishing which removes the portion of the semiconductor material 74 that was previously located between adjacent patterned material stack portions.

The resultant structure illustrated, for example, in FIG. 22, is planar. That is, an uppermost surface of the photonic SOI layer 74' is coplanar to the upper surface of the semiconductor substrate 50. At this point of the present disclosure, isolation trenches and bulk semiconductor devices can be formed. The processes used in forming the isolation trenches and bulk semiconductor devices can include the same processing as mentioned above in FIGS. 10-13 of the present disclosure.

Referring now to FIGS. 23-33, there is illustrated yet another embodiment of the present disclosure. This embodiment of the present disclosure begins by first providing the structure shown, for example, in FIG. 2. Next, a patterned photoresist 80 is formed atop the oxygen-impermeable layer 14 providing the structure shown, for example, in FIG. 23. The patterned photoresist 80 can be formed using the same technique as described above in forming patterned photoresist 16.

Figure 24:
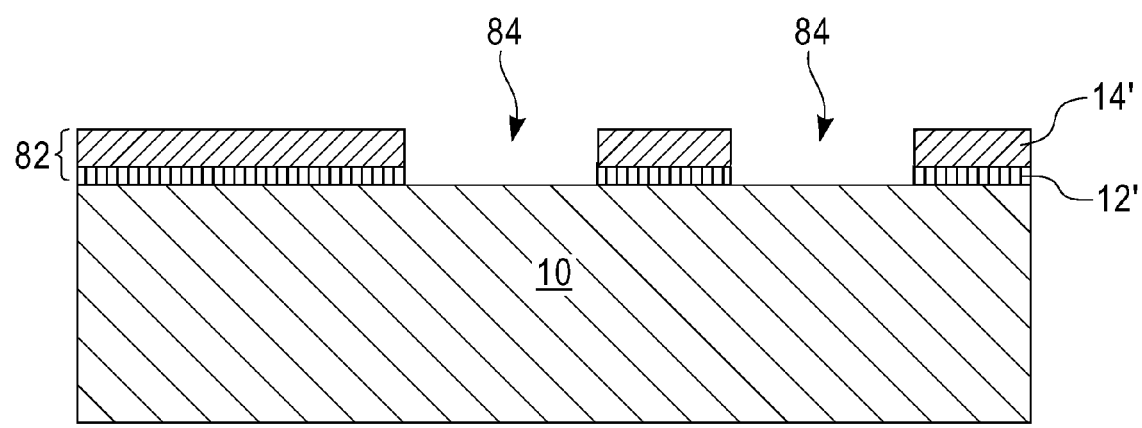
FIG. 24 is a vertical-cross sectional view illustrating the structure of FIG. 23 after transferring the pattern from the patterned photoresist into the oxygen-impermeable layer and pad oxide and stripping the patterned photoresist forming a patterned material stack atop the semiconductor substrate.

Next, and as shown in FIG. 24, the pattern from the patterned photoresist 80 is transferred into the oxygen-impermeable layer 14 and pad oxide 12, and thereafter the patterned photoresist 80 is removed forming a patterned material stack 82 atop the semiconductor substrate 10. The transferring of the pattern from the patterned photoresist 80 into the stack of the oxygen-impermeable layer 14 and pad oxide 12 can be achieved using one of the etching processes mentioned above in forming the structure shown in FIG. 4 of the present disclosure. The patterned material stack 82 includes remaining portions of the oxygen-impermeable layer 14' and remaining portions of the pad oxide 12'. The patterned material stack 82 includes at least one (hereinafter just "the opening") opening 84 which exposes portions of the semiconductor substrate 10.

The patterned photoresist 80 can be removed after an upper surface of the semiconductor substrate 10 is physically exposed at the bottom of the opening 84. The removal of the patterned photoresist 80 from the structure can be achieved using a conventional stripping process such as, for example, ashing.

Figure 25:
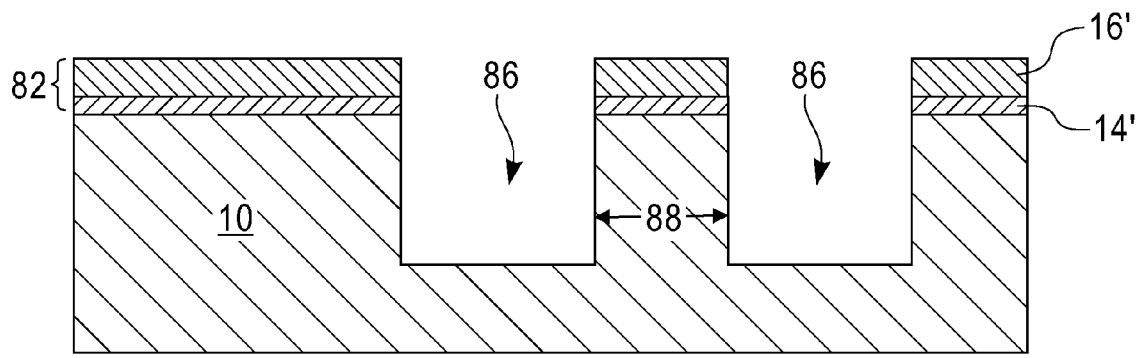
FIG. 25 is a vertical-cross sectional view illustrating the structure of FIG. 24 after forming a trench within the semiconductor substrate using the patterned material stack as an etch mask.

Referring now to FIG. 25, there is illustrated the structure of FIG. 24 after forming at least one (hereinafter just "the trench") trench 86 within the semiconductor substrate 10 using the patterned material stack 82 as an etch mask. The trench 86 can be formed using the anisotropic etch mentioned above in forming trench 22 with the structure illustrated in FIG. 5 of the present disclosure. Each trench 86 that is formed in this embodiment of the present disclosure can have the same characteristics as mentioned above for each trench 22 formed in the structure illustrated in FIG. 5 of the present disclosure. Moreover, a laterally insolated semiconductor portion 88 can be present between adjacent trenches 86.

Figure 26:
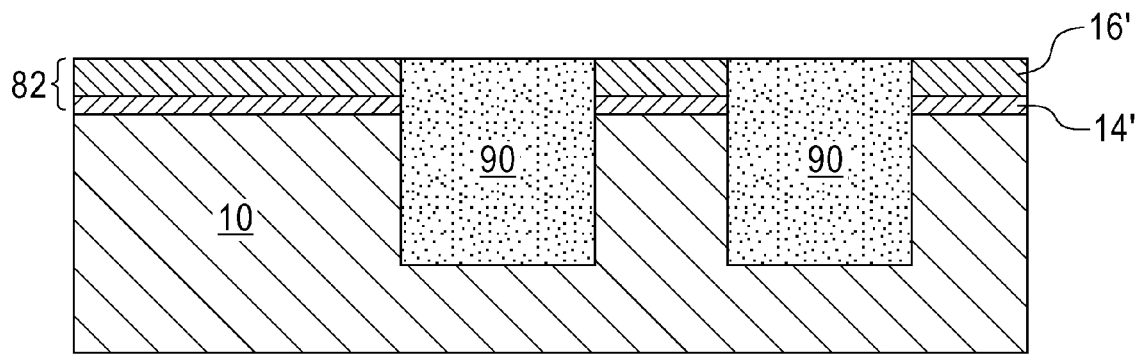
FIG. 26 is a vertical-cross sectional view illustrating the structure of FIG. 25 after filling the trench with an oxide and performing planarization.

Referring now to FIG. 26, there is illustrated the structure of FIG. 25 after filling each trench 86 and opening 84 with an oxide 90 and performing planarization. The oxide 90 that is formed into each trench 86 and opening 84 may include one of the materials mentioned above for oxide 26 that is formed into trenches 22 and openings 20. Also, oxide 90 can be formed utilizing one of the techniques mentioned above in forming oxide 26. The planarization process that follows the oxide fill may include chemical mechanical polishing. As shown, the planarization process stops atop the uppermost surface of the patterned material stack 82.

Figure 27:
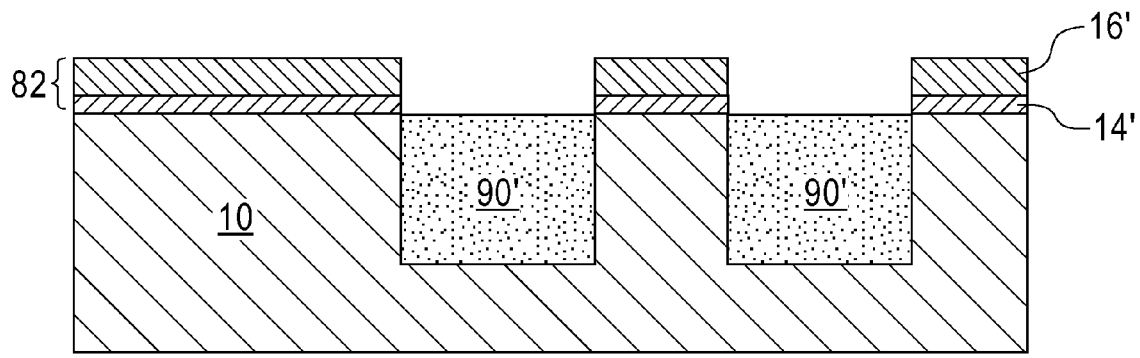
FIG. 27 is a vertical-cross sectional view illustrating the structure of FIG. 26 after performing a controlled oxide recess etch which removes oxide down to the upper surface of the semiconductor substrate.

Referring now to FIG. 27, there is illustrated the structure of FIG. 26 after performing a controlled oxide recess etch which removes oxide 90 from the opening 84 as well as a portion of trench 86. As shown, this recess etch removes oxide 26 below to the upper surface of the semiconductor substrate 10. The remaining oxide 90' within each trench 90 will subsequently become a buried oxide (BOX) of the structure. The oxide 90 can be recessed utilizing a timed controlled reactive ion etch. Like remaining oxide 26', remaining oxide 90' has a thickness which is sufficient to keep light trapped within a SOI layer to be subsequently formed.

Figure 28:
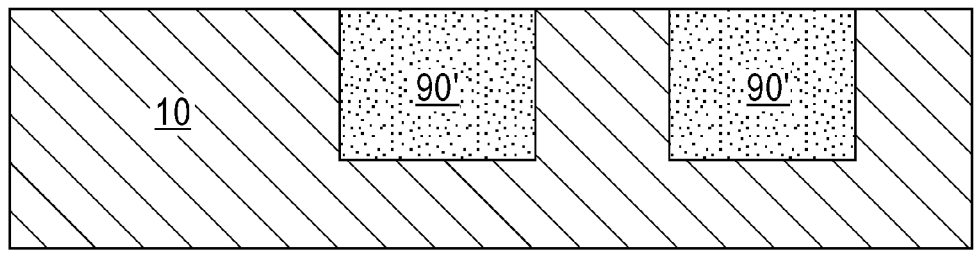
FIG. 28 is a vertical-cross sectional view illustrating the structure of FIG. 27 after removing the patterned material stack from atop the semiconductor substrate.

Referring now to FIG. 28, there is illustrated the structure of FIG. 27 after removing the patterned material stack 82 from atop the semiconductor substrate 10. In one embodiment, the patterned material stack 82 can be removed by planarization. In another embodiment, one or more etching processes can be used to remove the patterned material stack 82 from the structure.

Figure 29:
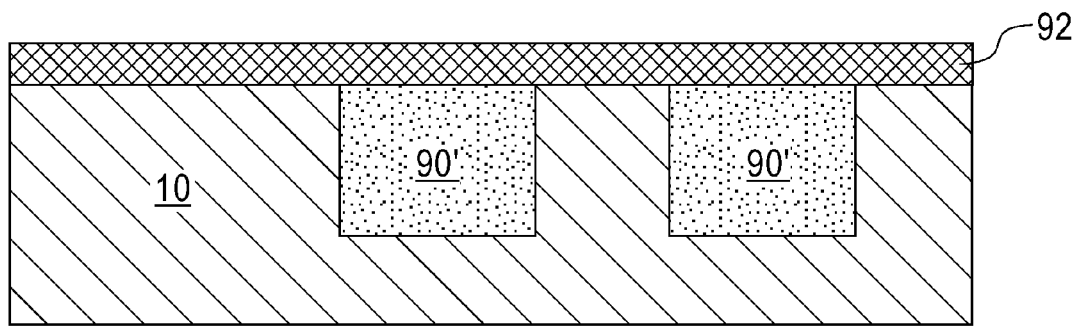
FIG. 29 is a vertical-cross sectional view illustrating the structure of FIG. 28 after forming another oxygen-impermeable layer atop the semiconductor substrate.

Referring now FIG. 29, there is illustrated the structure of FIG. 28 after forming another oxygen-impermeable layer 92 atop the semiconductor substrate 10. As shown, the another oxygen-impermeable layer 92 spans across semiconductor material portions as well as oxide 90' portions. The another oxygen-impermeable layer 92 may include one of the materials mentioned above for oxygen-impermeable layer 14. Also, the another oxygen-impermeable layer 92 may be formed, and may have a thickness, as described above for oxygen-impermeable layer 14.

Figure 30:
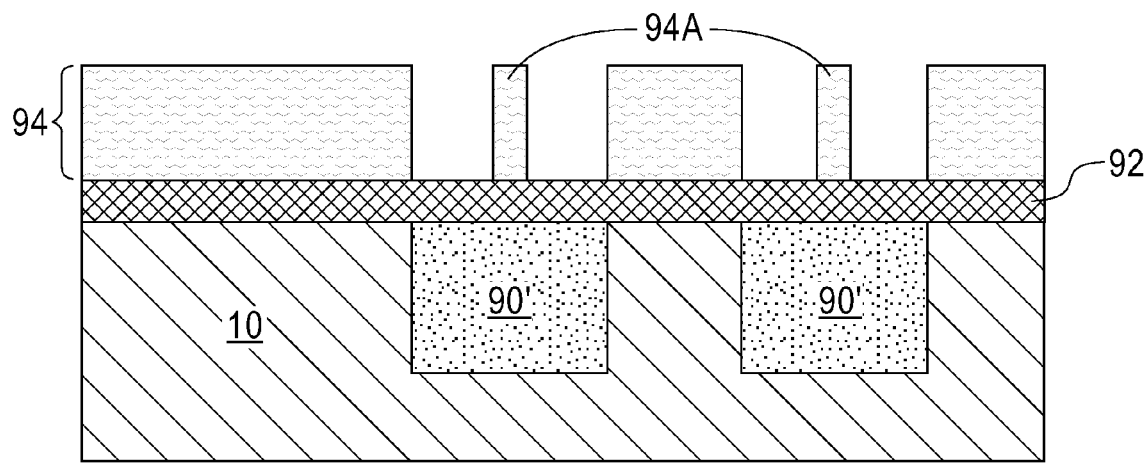
FIG. 30 is a vertical-cross sectional view illustrating the structure of FIG. 29 after forming another patterned photoresist atop the another oxygen-impermeable layer.

Referring now to FIG. 30, there is illustrated the structure of FIG. 29 after forming another patterned photoresist 94 atop the another oxygen-impermeable layer 92. The another patterned photoresist 94 can be formed using the technique mentioned above for forming patterned photoresist 16. In this embodiment, the another patterned photoresist 94 includes a resist portion 94A that is located above a portion of oxide 90'.

Figure 31:
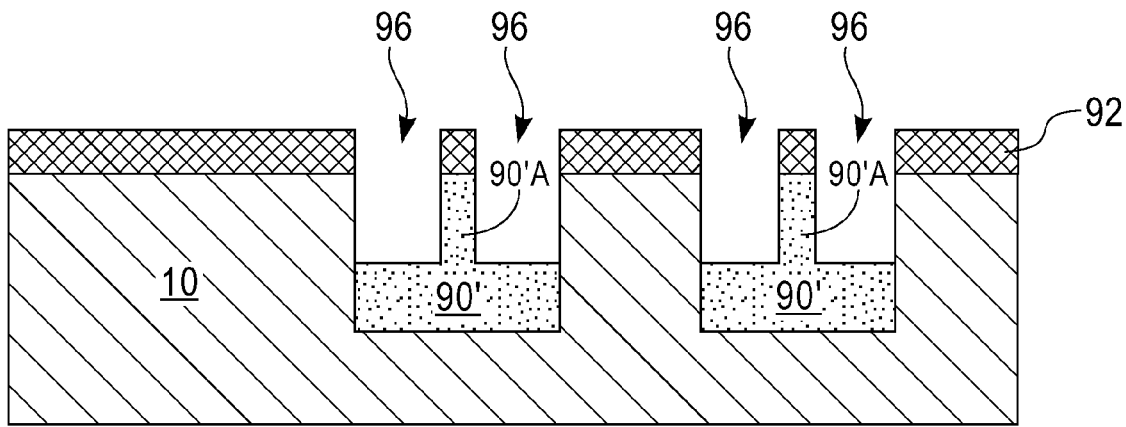
FIG. 31 is a vertical-cross sectional view illustrating the structure of FIG. 30 after performing another controlled etching process which forms a pair recess regions within the oxide filled trench.

Referring now to FIG. 31, there is illustrated the structure of FIG. 30 after performing another controlled etching process which forms a pair of recess regions 96 within each of the oxide filled trench (90',86), and removing the another patterned photoresist 94, including resist portion 94A. Specifically, this controlled etching process removes exposed portions of the another oxygen-impermeable layer 92 that are not protected by the another patterned photoresist 94, as well as underlying portions of the remaining oxide 90'. As shown, sidewall portions of the semiconductor substrate 10 are exposed after the controlled etch. Also, each trench 86 includes a pair of recess regions 96 which are isolated by oxide pillar portion 90'A. In one embodiment, the another controlled etching process comprises a timed reaction ion etching process.

The another patterned photoresist 94 and resist portion 94A are removed after the controlled etch utilizing a conventional resist stripping process such as, for example, ashing.

Figure 32:
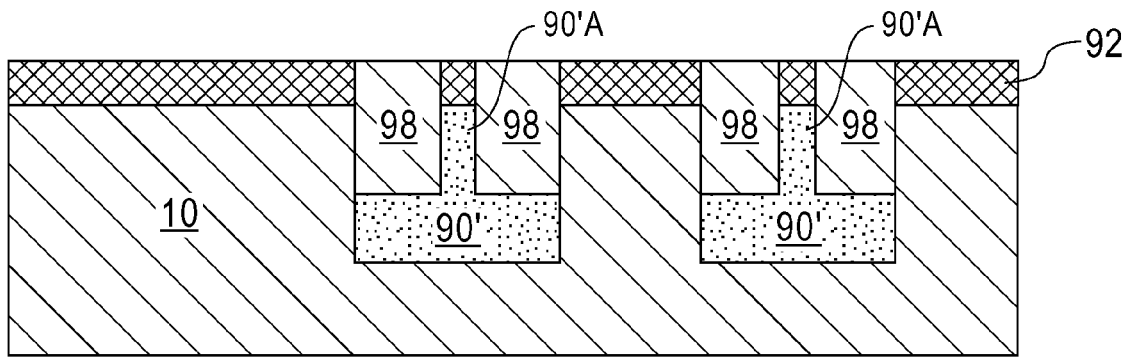
FIG. 32 is a vertical-cross sectional view illustrating the structure of FIG. 31 after epitaxially growing a semiconductor material from physically exposed sidewall surfaces of the semiconductor substrate within each of the recess regions.

Referring now to FIG. 32, there is illustrated the structure of FIG. 31 after epitaxially growing a semiconductor material 98 from physically exposed sidewall surfaces of the semiconductor substrate 10 within each of the recess regions 96. In the present disclosure, the epitaxial growing of semiconductor material 98 includes the same epitaxial growth process mentioned above in forming the semiconductor material 28.

Figure 33:
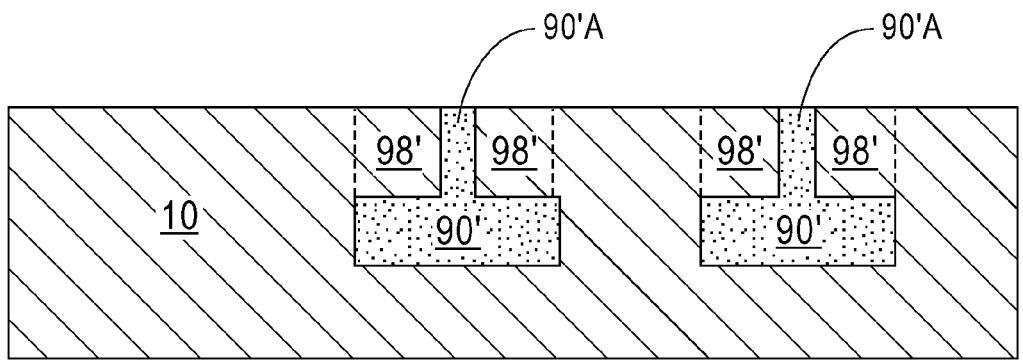
FIG. 33 is a vertical-cross sectional view illustrating the structure of FIG. 32 after removing the remaining patterned portions of the another oxygen-impermeable layer from atop the semiconductor substrate and planarization of localized SOI layer.

Referring now to FIG. 33, there is illustrated the structure of FIG. 32 after removing the remaining patterned portions of the another oxygen-impermeable layer 92 from atop the semiconductor substrate 10. Before, during, or after the removal of the remaining patterned portions of the another oxygen-impermeable layer 92 from the structure, a portion of the semiconductor material that is located above the uppermost surface of semiconductor substrate 10 can also be removed. The remaining portion of the semiconductor material 98 that is located between the physically exposed sidewall surfaces of the semiconductor substrate 10 and above the remaining oxide 90' can be referred to herein as a photonic SOI layer 99'. As shown, each trench 86 includes two photonic SOI layers 98' that are laterally isolated by oxide pillar portion 90'A.

The resultant structure illustrated, for example, in FIG. 33, is planar. That is, an uppermost surface of each photonic SOI layer 98' is coplanar to the uppermost surface of the semiconductor substrate 10. At this point of the present disclosure, isolation trenches and bulk semiconductor devices can be formed. The processes used in forming the isolation trenches and bulk semiconductor devices can include the same processing as mentioned above in FIGS. 10-13 of the present disclosure.

Figure 34:
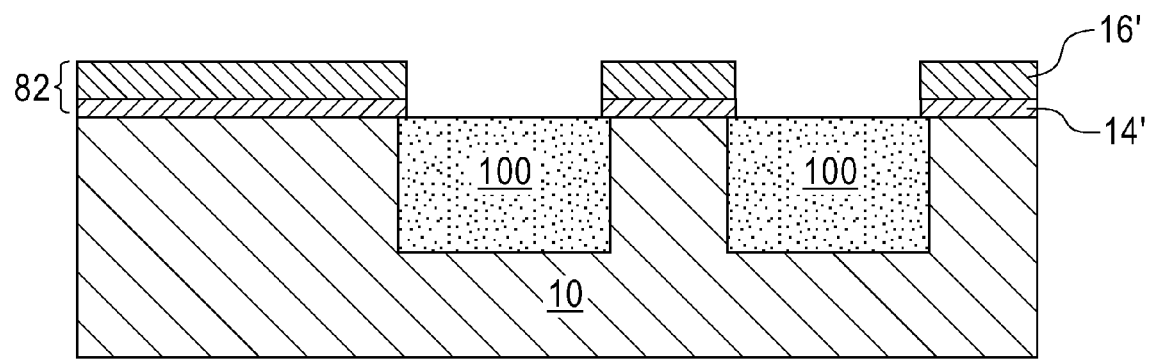
FIG. 34 is a vertical-cross sectional view illustrating the structure of FIG. 25 after performing an oxidation process which fills each trench with a semiconductor oxide.
Figure 35:
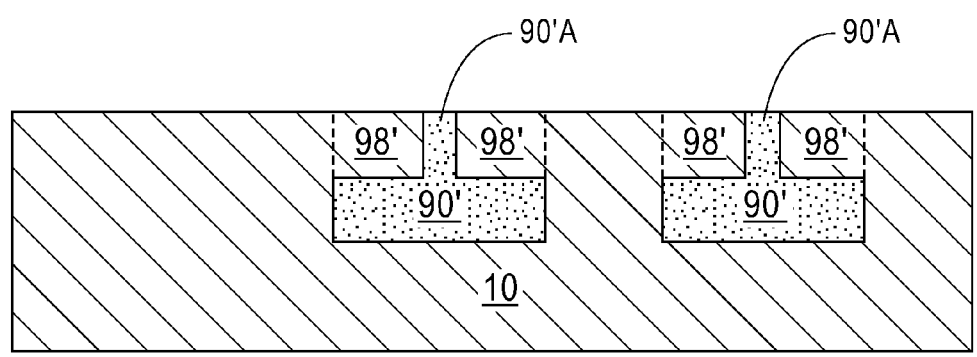
FIG. 35 is a vertical-cross sectional view illustrating the structure of FIG. 34 after performing various other processes steps of the present disclosure.

Referring now to FIGS. 34-35, there are illustrated yet another embodiment of the present disclosure. This embodiment of the present disclosure begins by first providing the structure shown, for example, in FIG. 2. Next, a patterned photoresist 80 is formed atop the oxygen-impermeable layer 14. The patterned photoresist 80 can be formed using the same technique as described above in forming patterned photoresist 16.

FIG. 34 is a vertical-cross sectional view illustrating the structure of FIG. 25 after performing an oxidation process which fills each trench 86 with a semiconductor oxide 100. In one embodiment, the semiconductor oxide 100 is silicon oxide. In another embodiment, the semiconductor oxide is germanium oxide. The oxidation process that is used in the present disclosure includes heating the structure shown in FIG. 25 at a temperature of 900° C. or greater in an oxygen-containing ambient.

After forming the structure shown in FIG. 34, that structure is subjected to the various processing steps mentioned above in connection with FIGS. 27-33 of the present disclosure to provide the planar structure illustrated in FIG. 35. In FIG. 35, element 100' denotes the remaining thermally grown semiconductor oxide; all other reference numerals shown in FIG. 25 are the same as reference numerals shown in the structure shown in FIG. 33 of the present disclosure. At this point of the present disclosure, isolation trenches and bulk semiconductor devices can be formed. The processes used in forming the isolation trenches and bulk semiconductor devices can include the same processing as mentioned above in FIGS. 10-13 of the present disclosure.

The methods of the present disclosure have advantages over the prior art (such as, for example, H-C. Ji et al, 7th IEEE International Conference on Group IV Photonics (GFP), pp. 96-98, September 2010), such as utilization of selective epitaxial growth on a small crystalline semiconductor window (or area) as a seed instead of deposition of blanket amorphous semiconductor layer over the whole bulk silicon substrate. Selective epitaxy with such a low pattern factor and relatively small and uniform features, minimize defect density and result in higher quality Photonics SOI without affecting the bulk silicon used to fabricate other devices, such as CMOS.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims

What is claimed is:

1. A method of forming a semiconductor structure comprising:

providing a patterned material stack having at least one opening on an upper surface of a semiconductor substrate;

forming at least one trench within the semiconductor substrate utilizing said patterned material stack as an etch mask;

filling said at least one trench and said at least opening with an oxide;

recessing portions of said oxide below said upper surface of said semiconductor substrate to expose sidewall surfaces of said semiconductor substrate within said at least one trench, wherein said recessing comprises removing said patterned material stack, forming a patterned photoresist over a central portion of said oxide, etching said portions of said oxide not protected by said patterned photoresist and removing said patterned photoresist to provide a pair of recessed openings that are separated by an oxide pillar extending upward from a remaining portion of said oxide; and epitaxially growing a semiconductor material from said exposed sidewall surfaces, wherein said semiconductor material completely fills each recessed opening.

2. The method of claim 1, wherein said providing the patterned material stack comprises:

forming a pad oxide on the upper surface of the semiconductor substrate;

forming an oxygen-impermeable layer on an exposed surface of said pad oxide;

forming a photoresist material on an exposed surface of said oxygen-impermeable layer;

patterning said photoresist material by lithography; and transferring a pattern from said photoresist material into said oxygen-impermeable layer and said pad oxide.

3. The method of claim 1, wherein said forming said at least one trench comprises forming a pair of trenches within said semiconductor substrate, wherein a first trench of said pair of trenches is separated from a second trench of said pair of trenches by a laterally isolation semiconductor material portion of said semiconductor substrate.

4. The method of claim 1, wherein said filling said at least one trench and said at least opening with said oxide comprises a deposition process.

5. A method of forming a semiconductor structure comprising:

providing a patterned material stack having at least one opening on an upper surface of a semiconductor substrate;

forming at least one trench within the semiconductor substrate utilizing said patterned material stack as an etch mask;

filling said at least one trench and said at least opening with an oxide;

removing said patterned material stack from said upper surface of said semiconductor substrate, wherein said oxide remains within said at least one trench;

forming a pair of recessed regions within said oxide, wherein an oxide pillar portion separates one of said recessed regions from another of said recessed regions and wherein sidewall surfaces of said semiconductor substrate within said at least one trench are exposed, and wherein said forming said pair of recessed regions comprises forming a patterned photoresist over a central portion of said oxide, etching portions of said oxide not protected by said patterned photoresist and removing said patterned photoresist;

epitaxially growing a semiconductor material from said exposed sidewall surfaces, wherein said semiconductor material completely fills each of said recessed regions;

removing excess semiconductor material present above the upper surface of the semiconductor substrate.

6. The method of claim 5, wherein said providing the patterned material stack comprises:

forming a pad oxide on the upper surface of the semiconductor substrate;

forming an oxygen-impermeable layer on an exposed surface of said pad oxide;

forming a photoresist material on an exposed surface of said oxygen-impermeable layer;

patterning said photoresist material by lithography; and transferring a pattern from said photoresist material into said oxygen-impermeable layer and said pad oxide.

7. The method of claim 5, wherein said forming said at least one trench comprises forming a pair of trenches within said semiconductor substrate, wherein a first trench of said pair of trenches is separated from a second trench of said pair of trenches by a laterally isolation semiconductor material portion of said semiconductor substrate.

8. The method of claim 5, wherein said filling said at least one trench and said at least opening with said oxide comprises a deposition process.

9. The method of claim 5, wherein said forming said pair of recessed regions within said at least one trench further comprises:

forming an oxygen-impermeable layer on the upper surface of said semiconductor substrate including an uppermost surface of said oxide within said at least one trench prior to said forming said patterned photoresist; and removing said patterned photoresist and remaining portions of said oxygen-impermeable layer after said etching of said portions of said oxide not protected by said patterned photoresist.

\* \* \* \* \*